United States Patent [19]

Cairncross et al.

[11] Patent Number: 5,322,763
[45] Date of Patent: Jun. 21, 1994

[54] PROCESS FOR MAKING METAL LEDGE ON STENCIL SCREEN

[75] Inventors: Allan Cairncross, Hockessin; Chester A. Thayer, II, Wilmington, both of Del.

[73] Assignee: E. I. Du Pont de Nemours and Company, Wilmington, Del.

[21] Appl. No.: 879,211

[22] Filed: May 6, 1992

[51] Int. Cl.$^5$ .......................... G03F 7/00; G03F 7/12; G03C 5/00; G03C 8/00

[52] U.S. Cl. .................................. 430/308; 430/310; 430/204; 430/205; 430/320; 430/324; 430/326; 430/329; 101/128.4

[58] Field of Search ............... 430/205, 256, 258, 259, 430/308, 310, 324, 320, 204, 329; 101/128.9; 205/85

[56] References Cited

U.S. PATENT DOCUMENTS

| | | | |
|---|---|---|---|
| 2,854,386 | 2/1955 | Lyman et al. | 430/416 |
| 3,033,765 | 5/1962 | King et al. | 205/118 |
| 3,223,525 | 12/1965 | Jonker et al. | 430/414 |
| 3,424,581 | 1/1969 | Nawn et al. | 430/319 |
| 3,424,822 | 9/1969 | Blake | 525/255 |
| 3,600,185 | 8/1971 | McGuckin | 430/231 |
| 3,822,127 | 7/1974 | Tsuboi et al. | 430/248 |
| 4,118,288 | 10/1978 | Ruckl | 101/128.4 |
| 4,192,640 | 3/1980 | Merry | 430/248 |
| 4,772,540 | 9/1988 | Deutsch et al. | 430/324 |

FOREIGN PATENT DOCUMENTS

| | | | |
|---|---|---|---|
| 2050285 | 5/1972 | Fed. Rep. of Germany | 430/308 |
| 2158649 | 5/1972 | Fed. Rep. of Germany | 430/308 |
| 3120902 | 10/1978 | Japan | 101/128.4 |
| 9012482 | 10/1990 | PCT Int'l Appl. | 430/324 |
| 420125 | 11/1934 | United Kingdom | 430/308 |

Primary Examiner—Charles L. Bowers, Jr.
Assistant Examiner—J. Pasterczyk

[57] ABSTRACT

A process for making a metal ledge on one side of a metal screen involves exposing through the stencil screen a photoresist layer, removing unexposed photoresist areas, plating the metal stencil screen where the unexposed photoresist has been removed and removing the exposed photoresist.

2 Claims, No Drawings

PROCESS FOR MAKING METAL LEDGE ON STENCIL SCREEN

FIELD OF THE INVENTION

This invention relates to a process for making improved stencil screens which can be used for screen printing. More particularly, it relates to a process for making a polymeric or metal ledge on one side of the stencil screen.

BACKGROUND OF THE INVENTION

Screen printing is used in both the graphic arts and electronics industries. The basic concept in screen printing is to force a viscous material, an ink or paste, through apertures of a stencil screen. A stencil screen has solid areas which prevent printing and penetrable areas which allow the deposition of a pattern onto a substrate. The penetrable areas in the stencil screen can be mesh of the same or variable size, open areas with tie lines holding the solid areas together, or any combination of the above. Optionally, the stencil screen can have some open areas. For graphic arts applications the viscous material is usually an ink which is deposited on paper, fabric, plastic, etc. For electronic applications, thick film pastes of conductors, dielectrics and resistors can be screen printed onto appropriate electronic circuit substrates such as alumina or ceramic "green tape."

Many conventional stencil screens are made by applying a photosensitive emulsion to metal screen mesh. The photosensitive emulsion is exposed to light and hardened in areas corresponding to the solid areas of the stencil screen. The non-hardened areas are then removed with an appropriate solvent. This results in a screen in which some of the open areas have been filled with hardened resist to define a pattern.

When the above described stencil screens are placed on a substrate for printing, both the solid areas and the solid parts of the penetrable areas, i.e., the crossing wires of the mesh, are in contact with the surface of the substrate. Having the mesh contact the printing surface can cause problems for fine printing on smooth, nonporous, hard surfaces, and particularly for screen printing of thick film materials for electronic applications. When the mesh contacts the printing surface, the thick film material prints in a mesh pattern. Some material can run under the intersecting wire or fiber as the weave pattern keeps the grid off contact except at grid intersections. As the mesh is pulled away from the substrate, the paste partially runs together into a solid line, but there is insufficient material in the intersections of mesh with the solid areas to create a solid straight edge. This results in a deep scallop pattern at the edge of the line reflecting the position where each wire in the mesh pattern intersects the edge of the line. It is possible to improve the flow of the thick film material and pastes by decreasing the viscosity, but this can lead to other problems.

With stencil screens in which the solid areas are formed using photosensitive materials, this difficulty is overcome by impregnating the screen with an extra 0.2 to 0.4 mil (0.00051 to 0.0010 cm) thickness of photosensitive resist on one side. After the resist is imaged and developed the extra thickness remains in the solid areas. This is known as an "emulsion build". In screen printing, the stencil screen is placed on the substrate so that the emulsion build contacts the substrate and prevents the mesh areas from contacting the substrate surface. When the thick film paste is forced through the mesh, the paste flows together to fill the channel formed by the edges of the photoresist emulsion build. Thus solid lines are printed.

Some stencil screens are made completely out of metal materials. This can be accomplished by substractive processes, in which metal is removed from areas intended to be penetrable. Metal stencil screens can also be made by additive plating processes. With either type of process there is no opportunity to form a layer that would function as the emulsion build described above.

There exists a need for metal stencil screens which have a layer which functions as an emulsion build. In addition, there is a need for metal stencil screens which have a metal layer which functions as an emulsion build.

SUMMARY OF THE INVENTION

The above needs are satisfied by the present invention which provides a process for making a polymeric ledge on one side of a metal stencil screen, said stencil screen having solid areas which prevent printing, penetrable areas through which printing can occur, and optionally open areas through which printing can occur, said penetrable areas being selected from (i) mesh, (ii) open areas bridged with tie lines and combinations of (i) and (ii), said process comprising the steps:

(a) applying a polymeric layer to one side of the metal stencil screen, said polymeric layer being soluble, swellable, or dispersible in a predetermined developer solution, and (b) applying the developer solution through the penetrable areas resulting in the polymeric layer being removed in the penetrable areas and remaining in the solid areas.

In a second embodiment this invention provides a process for making a metal ledge on one side of a metal stencil screen, which comprises the steps:

(a) applying a layer of a photoresist to one side of the metal stencil screen and (b) exposing the photoresist to actinic radiation through the stencil screen resulting in insolubilization of the photoresist in the penetrable areas, (c) removing the areas of the photoresist which have not been insolubilized with a first solvent, (d) plating the metal stencil screen on the side of the photoresist in those areas not covered by the photoresist, and (e) removing the remaining photoresist in the penetrable areas with a second solvent.

In a third embodiment, this invention provides a process for making a polyimide ledge on one side of a metal stencil screen, which comprises the steps:

(a) forming a layer of electrically conducting silver on a polyimide support in a pattern corresponding to the stencil screen by silver salt photographic imaging, said silver layer having a surface resistance of less than 200,000 ohms as measured between two point probes separated by one centimeter, (b) plating the layer of silver with a second metal to form a metal-plated silver pattern, and (c) applying a liquid to completely remove the polyimide support in the penetrable areas of the stencil screen while leaving the polyimide support only partially etched in the solid areas to form the polymeric ledge, wherein the liquid comprises an aqueous solution of hydroxide salts and a compound selected from the group consisting of alcohols, amines, and mixtures thereof.

Definitions

As used herein, the following terms have the meanings indicated below.

The term "stencil screen" refers to a part for screen printing comprising solid metal areas which prevent printing, i.e., prevent ink or paste from passing through, penetrable areas through which printing can occur, and optional open areas through which printing can occur. The penetrable areas are selected from (i) metal mesh, (ii) open areas bridged with metal tie lines, and combinations of (i) and (ii). The mesh can be of the same or variable size. In the penetrable areas, the printing material, i.e., ink or paste, flows through the openings and around the wires of the mesh or the tie lines onto the substrate. Usually printing is desired throughout the entire penetrable area. To accomplish complete printing, mesh wires or tie lines must be thin, the ink or paste viscosity must be sufficiently low to allow leveling, or the substrate surface must be rough or porous, otherwise the mesh or tie line pattern itself will be printed.

The term "ledge" refers to an extra thickness of material on one side of the stencil screen in the solid areas. The material can be polymeric or metallic. In the printing process the stencil screen is placed on the substrate to be printed in such a way that the ledge is adjacent to the substrate.

The term "photoresist," as used herein, is intended to mean material which, when exposed to actinic radiation, becomes less dispersible, i.e., removable, in a given developer liquid.

DETAILED DESCRIPTION OF THE INVENTION

The invention relates to a process for making a metallic or polymeric ledge on one side of a metal stencil screen. Both types of ledges have advantages and disadvantages. A polymer ledge is known to provide good contact (gasketing) to the printing substrate surface. However, the polymer ledge can be subject to chemical attack by thick film solvents and is not very abrasion resistant. On the other hand, a metal ledge is very resistant to chemicals and abrasion, but may not provide the gasketing desired. Using the process of the invention, a metal ledge or a polymeric ledge can be chosen depending upon the needs of the end use of the stencil screen.

In a first embodiment of the invention, a polymeric ledge is prepared on one side of a metal stencil screen. This is accomplished by covering one side of the stencil screen with a layer of a polymeric layer. Polymeric materials are well known and many different kinds are commercially available. For this embodiment, the polymeric materials need to be readily applied to metals in thin layers, must adhere well to metals, and must be removable by some liquid developer. Examples are thermoplastic polymers, coatable polymer latexes and solutions, and multicomponent products containing polymeric binders and other components such as plasticizers, stabilizers, adhesion promotors, solvents, dispersing agents, curing agents, crosslinking agents and photoactive groups that alter the solubility of the composition, as in a photoresist. Commercially available resists and photoresists are already designed for attachment to metals in thin layers and easy removal with a development liquid.

The polymeric material should be chosen to be essentially inert to the ink or paint to be printed, particularly to the solvents contained therein. Thus the developer used in this process needs to be quite different in chemical behavior or solvency from the solvents found in the inks and pastes to be used. For example, a polymer that is soluble in hydrocarbon solvent developer could be used in this embodiment with water based inks and pastes. A polymeric material that can be crosslinked after development is particularly versatile since once crosslinked, the material becomes insoluble and compatible with a wider range of ink and paste solvents. A laminable thin film photoresist such as the Riston® family of resists (E. I. du Pont de Nemours & Co., Wilmington, Del.) is an example of a polymeric material suitable in the practice of the invention.

The polymeric materials can be applied as a coating of a liquid or laminated as a film. It is preferred that the polymeric material be applied as a film. After application of the polymeric material to the metal stencil screen, a developer liquid for the polymeric material, i.e., one in which the polymeric material is soluble, swellable, or dispersible, is applied through the penetrable and open areas of the stencil screen. Examples of suitable developers are well known and include organic solvents, such as aliphatic or aromatic hydrocarbons, esters, ketones, ethers, and alcohols or mixtures of such solvents; semi-aqueous solutions, such as solutions of a water-miscible organic solvent and an alkaline material in water; or an aqueous solution, such as a solution of an alkali or acid in water. The polymeric material is dispersed in the developer and completely removed only in the penetrable and open areas where the polymeric material is available for removal on both front side covered by the stencil screen and the back side. In the solid non-printing areas of the metal stencil screen the solid metal protects the front side of the polymeric material from removal and, after development, polymer remains on the stencil screen in the solid areas as a polymeric ledge.

In a second embodiment of the invention, a metal ledge is prepared on a metal stencil screen. In this embodiment, a photoresist is applied to one side of the metal stencil screen. The resist is then exposed to actinic radiation through the stencil screen, i.e., the stencil screen is used as a photomask. The resist material which is over the solid metal areas remains unexposed to the radiation. The resist material which is over the penetrable or open areas is exposed. Thus the polymerization and crosslinking reactions take place in the penetrable and open areas. Part of the photoresist over the penetrable areas is shielded by the mesh wire and/or tie lines. Therefore, it may be necessary to slightly overexpose the resist in order to ensure that polymerization or crosslinking takes place in the entire area.

After the exposure step, the resist is developed with a developer liquid which removes the unexposed areas of the resist. Suitable developers for this step were discussed above. Development results in a stencil screen in which the penetrable and open areas are covered with photoresist. This is then electroplated to an additional metal thickness of from about 0.1 to 2.0 mils (0.00025 to 0.0051 cm); preferably 0.2 to 0.4 mils (0.00051 to 0.0010 cm). Suitable metals for electroplating include copper, nickel, gold, silver, palladium, zinc, chromium tin, lead, cobalt and their alloys. A preferred metal is copper.

After the electroplating step, the remaining photoresist is removed by the application of a second solvent (stripper). The second solvent must be one in which the photopolymerized or photocrosslinked resist is dispersible. Examples of suitable solvents are well known in the art and include acidic and basic solutions, methylene chloride, and mixtures of methylene chloride with lower alcohols and ketones; phenols, and cresols; chlorinated benzenes and high-boiling aliphatic chlorinated hydrocarbons.

In a third embodiment of the invention, a polyimide polymeric ledge is formed as an integral part of the process of forming a metal stencil screen. In this embodiment, a layer of electrically conducting silver is formed on a polyimide support in a pattern corresponding to the stencil screen by silver salt photographic imaging. The conductive pattern of silver is then plated with a second metal to form a metal-plated silver pattern. To this is applied a liquid which is capable of etching the polyimide. The etching liquid removes the polyimide completely in the penetrable and open areas of the stencil screen pattern, but only partially in the solid areas. The remaining layer of polyimide in the solid areas functions as the polymeric ledge.

Silver salt photographic processes are well known. It is preferred to use silver diffusion transfer imaging. In these processes, an exposed silver halide emulsion layer is developed in contact with a receptor layer which contains diffusion transfer nuclei. The developer includes a compound which complexes the undeveloped silver halide, allowing it to diffuse to the receptor layer where the diffusion transfer nuclei catalyze the formation of metallic silver. The silver image which is formed may or may not be electrically conductive. Examples of silver diffusion transfer processes which result in a conducting silver image have been disclosed in, for example, U.S. Pat. Nos. 4,069,759 and 4,192,640.

Silver diffusion transfer processes which are particularly suitable for forming the stencil screen include a single sheet diffusion washoff process (DTWO) and a two-sheet photomechanical transfer process (PMT).

When a DTWO system is used, the diffusion transfer nuclei are first coated onto the polyimide support. Silver halide containing photosensitive material is applied as a layer, usually referred to as the "emulsion layer", overlying the diffusion transfer nuclei. The photosensitive silver halide layer is exposed to actinic radiation imagewise and then developed with a diffusion transfer developer. The conducting silver image forms on the surface of the polyimide support and the emulsion layer is removed by washing.

When a PMT process is used, the diffusion transfer nuclei are again coated onto the surface of the polyimide support. The silver halide containing photosensitive material is applied as a layer onto a second support. The photosensitive silver halide layer is exposed to actinic radiation imagewise. The exposed silver halide layer is then pressed into intimate contact with the diffusion transfer nuclei on the polyimide support and developed with a diffusion transfer developer. The conducting silver image forms on the surface of the polyimide support. The emulsion layer is removed from the conducting silver image by peeling the two supports apart.

The diffusion transfer nuclei are particles which act as catalytic sites to aid in the reduction of complexed silver ions to silver metal. Suitable diffusion transfer nuclei for silver diffusion transfer processes are well known in the art.

The silver halide containing photosensitive layer generally comprises a dispersion of silver halide grains in a hydrophilic binder. The binder can be any of the substances commonly used in diffusion transfer processes, for example, gelatin. The silver halide can be any of the well-known salts used in photographic applications. Precipitation of the halide is generally carried out in gelatin using conventional techniques.

The silver halide layer may be either positive or negative-working. Ordinarily, the silver salt dispersions will be sensitized with conventional compounds such as those of sulfur, gold, rhodium, selenium and the like, or with organic sensitizing dyes. Other additives commonly employed in silver halide photographic compositions, may also be present if desired.

The amount of silver halide present is generally 5 to 80 mg/dm$^2$ silver with 10 to 15 mg/dm$^2$, usually 15 mg/dm$^2$ silver, used for single sheet diffusion transfer wash off version.

For stencil screens having very fine details it may be desirable to have strong adhesion between the polyimide support and the silver pattern. Suitable surface treatments which will result in strong adhesion include chemical and physical treatments to make a microscopically thin surface layer of greater hydrophilicity on the support. Such treatments have been disclosed in U.S. Pat. No. 5,043,244.

After the diffusion transfer nuclei and the silver halide containing photosensitive material have been applied to the polyimide support (or second support), the silver halide layer is exposed imagewise to actinic radiation. The pattern used for the imagewise exposure will correspond to either a positive or negative of the desired stencil screen. An optimized pattern can be most easily accomplished in a CAD system where the pattern is designed electronically, modified with the preferred mesh or tie line patterns in the CAD system, and plotted out onto a photomask material or directly on the diffusion transfer film.

The exposure step can be carried out using any radiation source that is commonly used with silver halide photographic materials, such as by imaging with UV, visible, or infrared light, a cathode ray tube, electron beam, or laser.

After exposure, the silver halide layer is contacted with a developer solution and pressed into intimate contact with the diffusion transfer nuclei treated support layer. For a one-sheet system, i.e., DTWO, this is accomplished by passing the sheet through the developer solution. For a two-sheet system, i.e., PMT, the two sheets are wetted with the developer and then pressed together between rollers with the silver halide layer in contact with the side of the support which contains the development nuclei. Development can be done flat or in curved configurations with flexible and rigid substrates. Developing baths for the diffusion transfer process are well known in the art and are described, for example, in *Photographic Silver Halide Diffusion Processes* by Andre Rott and Edith Weyde (Focal Press, 1972) and *Modern Photographic Processing*, Vol. 2 by Grant Haist (Wiley 1979).

In DTWO systems the diffusion transfer nuclei are on a surface portion of the polyimide support and the metallic silver image is deposited on that support. In a one-sheet DTWO system, the top emulsion layer which originally contained the silver halide is then removed, usually by washing. Preferably the emulsion layer is washed off in an acid solution with a pH in the range of 0-5, usually 10% by volume acetic acid. In a two-sheet PMT system the two sheets are peeled apart thus removing the emulsion layer from the support.

Following treatment with the developer solution, it may be advantageous that the system be treated with an acid stop. When the acid stop step is not used, the silver screen image may be damaged in rinse steps. The acid stop also assists in the removal of the emulsion layer for DTWO systems. It is preferred that the acid stop be carried out simultaneously with the removal of the layer which originally contained the silver halide (usually gelatin). The acid stop solution should have a pH less than about 5. A preferred acid stop solution is a 10% by volume aqueous acetic acid solution having a pH of 2.5.

All of the embodiments of this invention can be carried out on flat sheet stencil screens as well as 3-dimensional stencil screens. A particularly important 3-dimensional form is cylindrical stencil screens for use in rotary screen printing. The processes of this invention can add metal or polymer ledges to existing cylindrical stencil screens or can be used to make the entire cylindrical stencil screen with ledges. Particularly convenient is the third embodiment where a conducting pattern of the stencil screen is prepared on a polyimide substrate using silver diffusion transfer imaging, the pattern is plated up and assembled in cylindrical form with the metal on the inside, and the polyimide removed in the penetrable areas using a liquid developer.

When the support has been surface treated prior to application of the diffusion transfer nuclei, as discussed above, the developed silver image adheres more strongly to the support. In this case the acid stop may be omitted.

The silver image formed on the support is generally very thin and not strong enough to be separated from the support as a self-support sheet. Therefore, the silver image must be covered over with additional metal to improve the durability of the stencil screen. Examples of metals which can be used to cover or plate over the silver image include copper, nickel, or gold, silver, palladium, zinc, chromium, tin, lead and cobalt and their alloys. Any standard electroplating procedure can be used for this purpose.

The next step is to remove the polyimide in the penetrable and open areas and prepare the ledge. This is accomplished by a controlled etching step. In the etching step the polyimide substrate in the penetrable and open areas is accessible to the etching fluid on both sides and therefore is etched on both sides, while the polyimide in the solid areas is etched on only one side. Although the fine screen lines from the mesh and the fine tie lines cover areas of the polyimide, undercutting from the etching in the holes will quickly remove the polyimide in these areas as well. Thus, the polyimide in the solid areas will be removed only about half as fast as that in the penetrable and open areas. If the etching is stopped just as the polyimide is completely removed in the penetrable and open areas, there will remain a layer of polyimide on the solid areas which has a thickness approximately half that of the original polyimide substrate. The remaining polyimide layer is the polymeric ledge.

Etchants which can be used with polyimide substrates include aqueous solutions of hydroxide salts and a compound selected from the group consisting of alcohols, amines, and combinations thereof. A preferred etchant is an aqueous solution of an alcohol, a diamine and KOH as disclosed in U.S. Pat. No. 4,725,504.

The stencil screens made by the process of the invention are useful for conventional flat bed screen printing. For contact printing the stencil screen could be attached directly to a rigid frame and mounted in a screen printer. For off-contact printing, the stencil screen could be attached to a more flexible woven mesh screen which in turn is mounted to a rigid frame. The stencil screens are also suitable for rotary screen printing where the stencil screen is either plated up in a cylindrical shape or is formed and bonded in a cylindrical shape after plating. Rigid end rings are then attached to the cylindrical stencil screen and the cylinder mounted in a rotary screen printing press.

In the following examples all parts and percentages are by weight unless otherwise indicted.

EXAMPLES

EXAMPLE 1

This example illustrates the process of the invention in the formation of a polymeric ledge on a copper plated silver stencil screen.

A. Preparation of Silver Diffusion Transfer Photosensitive Film with Strippable Support A 4 mil (0.010 cm) thick base of Cronar ® polyester film (E. I. du Pont de Nemours & Co., Wilmington, Del.) was subbed with first polyvinylidine chloride and then gelatin. The subbed base was then coated with zinc sulfide diffusion transfer nuclei in a binder of styrene/methylmethacrylate/ethylacrylate/methacrylic acid (30/10/40/20 weight ratio) crosslinked with the diglycidyl ether of 1,4-butanediol, as described in U.S. Pat. No. 4,925,756, Example 29. After drying at 85° C., this was overcoated with a blue-sensitized camera speed high contrast emulsion of AgClBrI (Cl:Br:I=0.8:0.195:0.005) dispersed 2:1 in gelatin. The final binder layer coating weight was 9.3 mg/dm$^2$; the emulsion layer was 73.6 mg/dm$^2$.

B. Exposure of Diffusion Transfer Film to Stencil Screen Pattern

The film from Step A was superimposed in contact in a vacuum frame with (1) a 400 mesh electroformed screen having nickel wire mesh 7 micrometers deep and 14.5 micrometers wide, with a light transmission of 60% (Buckbee-Mears, St. Paul, Minn.) and (2) a negative phototool consisting of transparent line patterns with line widths of 3, 4 and 5 mils (0.0076, 0.0102, and 0.0127 cm, respectively). The screen lines were at a 45° angle from the line pattern to minimize Moire interference. The film was exposed for 19 seconds using light of 1.4 lux intensity from a tungsten lamp at 54 inches. A single exposure was used to create the latent image of the line pattern with a 400 mesh screen pattern within the lines.

C. Diffusion Transfer Development

A developer was prepared by mixing the following ingredients until dissolved:

| Ingredient | Amount (g) |
| --- | --- |
| Sodium sulfite (anhydrous) | 120.0 |
| Disodium EDTA | 2.0 |
| Sodium Phosphate, tribasic, 12 H$_2$O | 300.0 |
| Sodium Thiosulfate, 5 H$_2$O | 50.0 |
| Potassium bromide | 2.0 |

-continued

| Ingredient | Amount (g) |
| --- | --- |
| 2-Methylaminoethanol | 20.0 |
| Hydroquinone | 24.0 |
| Phenidone | 4.0 |
| Deionized water | 1178.0 |
| Du Pont CUFD developer, Part B | 48 ml |

(E. I. du Pont de Nemours & Co., Wilmington, Del.) The exposed film was developed for one minute at 26° C., and stopped in 10 volume % aqueous acetic acid at 26° C. The emulsion layer was removed by agitation and gentle rubbing with cotton and the electrically conductive image was rinsed in warm tap water. The image was mostly an opaque solid silver background with transparent 3, 4, and 5 mil lines (0.0076, 0.0102, and 0.0127 cm, respectively), containing within the lines a conductive fine line 400 mesh screen pattern. The solid areas had an optical density of 4.3, and 7 ohms resistance at 1 cm. The 400 mesh screen areas had an optical density (neutral filter) of 0.23, and 3,000 ohm resistance at 1 cm.

D. Electroplating with Copper and Separation of the Electroplated Stencil Screen from the Polyester Support The conducting silver image was electroplated with copper under conditions giving high bias for plating in the Z direction. An acid copper sulfate plating bath using Copper Gleam 125 (LeaRonal, Freeport, N.Y.) was used. The bath had the following composition:

| Component | % (Wt. or Vol.) |
| --- | --- |
| Copper Gleam 125 Carrier | 1.0 (v) |
| Copper Gleam 125 Additive | 0.5 (v) |
| Sulfuric Acid | 10.0 (v) |
| HCl, concentrated | 0.016 (v) |
| $CuSO_4 \cdot 5H_2O$ | 7.5 (v) |
| Carbon Powder (S free) | 0.6 (w) |
| Carbon Granules (S free) | 0.9 (w) |

The sample was plated for 10 minutes and 10 amps per square foot current density and 24 minutes at 21.5 amps per square foot.

Soon after the plating was complete the plated pattern was placed metal-side down on a flat surface. The polyester film and stencil screen were separated at a corner and the polyester film was rolled back away from the stencil screen, keeping the stencil screen flat and free from bends. The electroplated screen areas had a thickness of 0.67 mils (0.0017 cm) and an optical density (neutral filter) of 0.44.

E. Lamination of Photoresist Film

A 0.6 mil (0.0015 cm) thick photoresist film, Riston® 4106 (E. I. du Pont de Nemours & Co., Wilmington, Del.) was laminated to the silver side of the electroformed stencil screen at 100° C. and 1 meter per minute. The cover sheet was left on the laminate.

F. Development of the Laminated Resist

The laminate was conveyed through a spray processor with the open copper metal pattern facing toward the spray. A solution of 1% by weight sodium carbonate at 85° C. was sprayed on the sample for 2 minutes. This was sufficient to remove all the resist between the mesh patterns and cover sheet. Some undercutting occurred as well, averaging 0.5 mils (0.0013 cm) on both sides of line patterns. This compensated for line closure that occurred during the copper plating step so the final line width of the open line channel in the resist was close to that in the original phototool. The amount of undercutting was controlled by the resist development time.

When the washout was completed the resist was cured by overexposure to UV light. Finally the coversheet was stripped off to provide a laminate with open stencil screen pattern built up by a corresponding screenless image of 0.6 mils (0.0015 cm) of resist. This polymeric ledge consisted of screenless channels 0.6 mils (0.0015 cm) deep with nearly straight or smoothly curving edges to match the original artwork. This was clearly shown in photomicrographs.

G. Printing with Electroformed Stencil screen with Polymeric Ledge

The stencil screen with polymeric ledge from Step F was taped to a flat surface at the edge of a flat ceramic substrate and laid flat with no tension across the substrate. A rubber doctor blade was used to hand draw a copper paste (No. 9922, E. I. du Pont de Nemours & Co., Wilmington, Del.) across the screen in contact with the substrate and then the screen was lifted away from the substrate. Continuous lines were printed. At 35× magnification the line edges were fairly straight and smooth even though line thickness varied with the screen pattern. The most dramatic evidence of the value of the resist enhancement of the screen occurs around the edge of large screen-only areas. Here approximately the first 8 rows of screen cells printed as a solid due to the lifting of the screen off contact from the substrate by the resist thickness (0.6 mils, 0.0015 cm). But at more than about 8 screen cells in from the edge, under little tension, the screen sagged into contact with the substrate and printed an array of dots.

The paste coated stencil screen was cleaned up using Du Pont Solvent No. 9450 (E. I. du Pont de Nemours & Co., Wilmington, Del.) with no damage to the resist pattern in the polymeric ledge.

EXAMPLE 2

This example illustrates the preparation of an electroformed metal stencil screen with a metal ledge.

A-D. Preparation of Separated Electroformed Stencil screen using Silver Diffusion Transfer Imaging The procedures in Example 1, steps A through D, were repeated to prepare a conducting imaged 400 mesh silver screen pattern plated with 0.5 mils (0.0013 cm) copper. A current density of 15 amps per square foot was used. The polyester support was not removed at this point.

E. Application and Imaging of Photoresist

Riston® 4106 photoresist film (E. I. du Pont de Nemours & Co., Wilmington, Del.) was laminated in a Riston® Laminator (E. I. du Pont de Nemours & Co., Wilmington, Del.) at a feed rate of 1.2 meters/minute and a roller temperature of 104° C. The sheet was exposed from the back side with a Riston® PC 130 (E. I. du Pont de Nemours & Co., Wilmington, Del.) for an exposure of 160 counts. The photoresist was then developed using an aqueous sodium carbonate solution in a Riston® ADS-24 Developer (E. I. du Pont de Nemours & Co., Wilmington, Del.) set to a line speed of 475 (8 ft/min, 0.244 m/min) and a temperature of 85° F. (29° C.). This formed a column of photoresist over the screen areas only, leaving the background copper uncovered.

F. Electroplating to Form the Metal Ledge

The protected copper image from Step E was electroplated in a Lea Ronal (Freeport, N.Y.) acid copper plating bath to 1.1 mils (0.0028 cm) thickness. A current density of 30 amps per square foot was used. One stencil screen was cross-sectioned and photomicrographed at this point. It could be seen that a metal ledge had formed along the edge of the screen areas.

G. Removal of the Photoresist

The photoresist on the plated copper image was removed by dissolving it in methylene chloride.

H. Removal of the Support

The polyester support was peeled away from the copper plated silver stencil screen.

EXAMPLE 3

The example illustrates the formation of a polyimide ledge on a metal stencil screen.

A. Silver Diffusion Transfer Photosensitive Film on a Polyimide Support

A roll of 2 mil (0.0005 cm) thick Kapton ® polyimide film (E. I. du Pont de Nemours and Co., Inc., Wilmington, Del.) was continuously etched using an aqueous solution of KOH alcohol and ethylenediamine and catalyzed with colloidal palladium as described in U.S. Pat. No. 4,725,504, Examples 1 and 5.

The final thickness was 1.87 micrometers.

The catalyzed sample was continuously coated on a bar coated with a yellow light safe silver halide emulsion in which the silver halide was 100% by weight AgCl, and which was chemically sensitized with thiosulfate. The coating contained no hardener and had 16 mg/dm$^2$ silver content.

B. Exposure

In a vacuum frame the film from Step A was superimposed in contact with (1) a 400 mesh electroformed screen having nickel wire mesh 7 micrometers deep and 14.5 micrometers, with a light transmission of 60% (Buckbee-Meers, St. Paul, Minn.) and (2) a negative phototool consisting of transparent line patterns with line widths of 3, 4, and 5 mils (0.0076, 0.0102, 0.0127 cm, respectively). The screen lines were at a 45° angle from the line pattern to minimize Moire interference. The film was exposed for 4 minutes using a 1000 W tungsten halogen lamp at 48 inches. A single exposure was used to create the latent image of the line pattern with a 400 mesh screen pattern within the lines.

C. Diffusion Transfer Development

A developer was prepared by mixing the following ingredients until dissolved:

| Ingredient | Amount (g) |
| --- | --- |
| Sodium sulfite (anhydrous) | 120.0 |
| Disodium EDTA | 2.0 |
| Sodium phosphate, tribasic H$_2$O | 200.0 |
| Sodium thiosulfate, 5 H$_2$O | 50.0 |
| Potassium bromide | 2.0 |
| 2-Methylaminoethanol | 20.0 |
| Hydroquinone | 24.0 |
| Phenidone | 4.0 |
| deionized water | 1178.0 |
| Du Pont CUFD developer Part B | 48 ml. |

(E. I. du Pont de Nemours & Co., Wilmington, Del.) The exposed film was developed for one minute at 26° C., rinsed in 26° C. water for five minutes and rinsed in 47° C. water. The emulsion layer was removed by 30 second agitation, 30 seconds gentle cotton rub and a final spraying with the 47° C. water. The image was mostly an opaque solid silver background with transparent 3, 4, and 5 mil open line (0.0076, 0.0102, and 0.0127 cm, respectively), containing within the lines a conductive fine line 400 mesh pattern. The solid areas had optical density of 3.0, and 10 ohms resistance at 1 cm. The 400 mesh screen areas had an optical density of 0.11 greater than the polyimide film alone and a 1000 ohm resistance at 1 cm.

D. Electroplating with Nickel

The conducting silver stencil screen pattern was electroplated with nickel at a current density of 25 amperes per square foot in a Barrett SN sulfamate nickel bath with Barrett SNAP A/M antipitting agent (Allied Kelite, Melrose Park, Ill.). The nickel was 0.43 mils thick in solid areas and 0.46 mils in mesh areas and remained bonded to the 1.87 mils of polyimide.

E. Etching Open the Polyimide Through the Nickel Stencil Screen Pattern

An etchant was prepared as in U.S. Pat. No. 4,725,504, Example 1, consisting of an aqueous solution of 37.4 weight percent of KOH, 10 weight percent methanol, and 7 weight percent ethylenediamine. This etchant removed one half the thickness of trial pieces of 1.87 mil polyimide film in 9 minutes at room temperature etching from both sides simultaneously. The nickel plated stencil screen pattern attached to 1.87 mil polyimide was etched from both sides for 25 minutes, rinsed with cold water 30 seconds and rinsed with 50° C. water for 30 seconds. This was enough time to remove all the polyimide behind the screen openings, undercutting the screen pattern enough to remove the polyimide from behind the screen wires and to undercut the line pattern almost a mil. The final thickness was 0.90 mils or 0.43 mil nickel and 0.47 mils polyimide in a well bonded laminate.

This process created a polyimide polymer ledge on the silver side of the stencil screen with a line pattern free of the screen wire pattern. While the electroplating closed up the width of the screened line openings, the undercutting by the etchant compensated by opening up the line width in the polymer "ledge" side. The artwork, silver image formation, plating, and etching all can be adjusted to make the final opening in the "ledge" side match the desired printed line width. There was some undulation in the side walls of the ledge where the screen wires intersect due to interference by the wires in the etching process.

What is claimed is:

1. A process for making a metal ledge on one side of a metal stencil screen, said stencil screen having a first side and a second side, said stencil screen comprising solid areas which prevent printing and penetrable areas through which printing can occur, said penetrable areas being selected from (i) mesh, (ii) open areas bridged with tie lines and combinations of (i) and (ii), said process comprising the steps:

(a) applying a layer of a photoresist to the first side of the metal stencil screen, (b) exposing the photoresist to actinic radiation from the second side of the stencil screen resulting in insolubilization to a first solvent of the photoresist overlying the penetrable areas, (c) removing the areas of the photoresist which have not been insolubilized with the first solvent, leaving insolubilized photoresist covering the penetrable areas, (d) plating the first side of the metal stencil screen in those areas not covered by the photoresist, and (e) removing the remaining photoresist in the penetrable areas with a second solvent.

2. The process of claim 1 wherein the second side of the metal stencil screen is covered by a layer of polyester which is transparent to actinic radiation, wherein the process further comprises after step (e):

(f) removing the said layer of polyester from the metal stencil screen.

* * * * *